US012622278B2

(12) United States Patent
Yamamoto et al.

(10) Patent No.: US 12,622,278 B2
(45) Date of Patent: May 5, 2026

(54) SEMICONDUCTOR PACKAGE

(71) Applicants: MITSUBISHI HEAVY INDUSTRIES, LTD., Tokyo (JP); OTOWA ELECTRIC CO., LTD., Osaka (JP)

(72) Inventors: Syusaku Yamamoto, Tokyo (JP); Yuichiro Kamino, Tokyo (JP); Takatoshi Tojo, Hyogo (JP); Minoru Tsukazaki, Hyogo (JP); Naoyuki Tsukamoto, Hyogo (JP)

(73) Assignees: MITSUBISHI HEAVY INDUSTRIES, LTD., Tokyo (JP); OTOWA ELECTRIC CO., LTD., Osaka (JP)

( * ) Notice: Subject to any disclaimer, the term of this patent is extended or adjusted under 35 U.S.C. 154(b) by 361 days.

(21) Appl. No.: 18/261,547

(22) PCT Filed: Dec. 27, 2021

(86) PCT No.: PCT/JP2021/048669
§ 371 (c)(1),
(2) Date: Jul. 14, 2023

(87) PCT Pub. No.: WO2022/209090
PCT Pub. Date: Oct. 6, 2022

(65) Prior Publication Data
US 2024/0088067 A1     Mar. 14, 2024

(30) Foreign Application Priority Data
Mar. 31, 2021     (JP) ................................. 2021-059286

(51) Int. Cl.
*H10W 42/80*     (2026.01)
*H10W 42/20*     (2026.01)
*H10W 90/00*     (2026.01)

(52) U.S. Cl.
CPC ........... *H10W 42/80* (2026.01); *H10W 42/20* (2026.01); *H10W 90/00* (2026.01); *H10W 90/701* (2026.01); *H10W 90/754* (2026.01)

(58) Field of Classification Search
CPC .............................. H10W 42/80; H10W 42/20
See application file for complete search history.

(56) References Cited

FOREIGN PATENT DOCUMENTS

| CN | 1176491 A | * | 3/1998 | ........... | H01L 23/647 |
| JP | 49-085963 A | | 8/1974 | | |

(Continued)

OTHER PUBLICATIONS

International Search Report, International Application No. PCT/JP2021/048669, Date of mailing: Mar. 8, 2022, 2 pages.

*Primary Examiner* — Michele Fan
(74) *Attorney, Agent, or Firm* — Rankin, Hill & Clark LLP

(57) ABSTRACT

A device which enables protection against an abruptly rising pulse such as an electromagnetic pulse in a compact size at a device level and a semiconductor package in which the device is mounted are provided. The semiconductor package (1, 2, 3) includes a substrate (12, 60, 70), an IC chip (21) arranged on the substrate (12, 60, 70), a plurality of connection parts (30) configured to connect the IC chip (21) to the outside, a plurality of bonding wires (40) configured to connect the IC chip (21) and corresponding ones of the plurality of connection parts (30), and a mechanism configured to bypass surge current applied to any of the plurality of connection parts (30) from the connection parts (30) to a ground potential via a path different from the plurality of bonding wires (40).

3 Claims, 3 Drawing Sheets

(56) References Cited

FOREIGN PATENT DOCUMENTS

| | | | | | |
|---|---|---|---|---|---|
| JP | H05-335428 | A | | 12/1993 | |
| JP | 2001-007153 | A | | 1/2001 | |
| JP | 2003-234595 | A | | 8/2003 | |
| JP | 2004023108 | A | * | 1/2004 | .............. H01C 7/12 |
| JP | 2012-227229 | A | | 11/2012 | |

* cited by examiner

SEMICONDUCTOR PACKAGE

TECHNICAL FIELD

The present invention relates to an improved semiconductor package that can protect against a high-voltage pulse induced in an electronic circuit by electromagnetic pulse radiation or the like.

BACKGROUND ART

Conventionally, electronic circuits including semiconductor devices are used in many apparatuses. In electronic circuit equipment, various external factors such as a high-voltage pulse induced in an electronic circuit by electromagnetic pulse radiation are present in a usage environment in addition to surges represented by a lightning surge and a static surge. A surge protection device such as a varistor or an avalanche diode is used for surge protection, and it is considered that technologies concerning criteria for selection of those protection devices and application methods have mostly been established. However, few examples study device-level protection guidelines for a high voltage having an abrupt rise at a several nanosecond level induced by electromagnetic pulse radiation.

When a high-voltage pulse induced by an electromagnetic pulse represented by HEMP (High Altitude Electro Magnetic Pulse: a rapidly-rising and intense electromagnetic pulse induced by high altitude nuclear explosion) is applied to a lead inductance of a semiconductor device or the like, a terminal voltage increases, and the high voltage may be applied to bonding wires which connect a semiconductor package and a bear chip and to solder bumps. As a damage caused in a case where a high voltage exceeding a normal operation voltage is applied to a semiconductor device, a malfunction of the semiconductor device is conceivable first. In addition, since the bonding wires and the solder bumps are narrow conduction paths having diameters less than 100 μm, a likelihood that in a case where a high voltage of several hundred volts flows, they are fused and scattered to result in a physical breakage of the semiconductor device is anticipated. In other words, in a case where an electromagnetic pulse flows, a fatal situation for the device inevitably occurs. For the above reasons, a protection device targeted at a high-voltage pulse is becoming more important year by year.

Examples of a few countermeasures currently taken for such a high-voltage pulse include a method of covering the entire electronic circuit equipment which is a protection target with a Faraday cage as disclosed in Patent Literature 1.

CITATION LIST

Patent Literature

Patent Literature 1: Japanese Patent Laid-Open No. 49-85963

SUMMARY OF INVENTION

Technical Problem

However, the Faraday cage is an installation having a relatively massive and special structure, thus requiring extremely high introduction cost. Thus, in the present circumstances, the application thereof is extremely limited not only in consumer products but also in critical infrastructures. Consequently, most electronic circuit equipment existing in the world is in a state unprotected against rising voltages of several nanoseconds represented by an electromagnetic pulse.

The present invention was made to solve the above-described problem, and has an object to provide a semiconductor package in which a device which enables protection against an abruptly rising electromagnetic pulse such as an electromagnetic pulse at a device level is mounted.

Solution to Problem

A semiconductor package of the present invention includes a substrate, an IC chip arranged on the substrate, a plurality of connection parts configured to connect the IC chip to an outside, a plurality of bonding wires configured to connect the IC chip and corresponding ones of the plurality of connection parts, and a mechanism configured to bypass surge current applied to any of the plurality of connection parts from the connection parts to a ground potential via a path different from the plurality of bonding wires.

Preferably, the semiconductor package of the present invention further includes a seal lid arranged to be faced to the substrate, protection elements arranged in contact with surfaces of the plurality of respective connection parts on at least one side in a vertical direction and having a resistance value which decreases when a voltage of more than or equal to a predetermined value is applied, and conductive external bypass elements arranged in contact with surfaces of the protection elements on a side opposite to the plurality of respective connection parts, in which the external bypass elements are at least one of the external bypass elements arranged in contact with the substrate and the external bypass elements arranged in contact with the seal lid.

Preferably, in the semiconductor package of the present invention, the protection elements are arranged in contact with respective surfaces of the plurality of connection parts on both surface sides, the external bypass elements are arranged in contact with respective surfaces of the protection elements on the side opposite to the plurality of connection parts, and the external bypass elements include the external bypass elements arranged in contact with the substrate and the external bypass elements arranged in contact with the seal lid.

Preferably, the protection elements in the semiconductor package of the present invention are configured as nonlinear resistor bodies formed in a thin-film shape.

Preferably, in the semiconductor package of the present invention, adjacent ones of the protection elements are arranged separately from each other.

Advantageous Effects of Invention

According to the semiconductor package of the present invention, the semiconductor package includes the mechanism which bypasses surge current. This eliminates the need for a structure in which protection elements are added to the outside of the semiconductor package, which can minimize a substrate mounting area. This can prevent the bonding wires in the semiconductor package from breaking and the IC chip from malfunctioning at a device level even in a case where an abruptly rising electromagnetic pulse occurs.

According to the semiconductor package of the present invention, the protection elements having a resistance value which changes when a voltage of more than or equal to a predetermined value is applied are provided inside the semiconductor package. Thus, the semiconductor package can appropriately be prevented from breaking and malfunctioning.

According to the semiconductor package of the present invention, the protection elements provided inside the semiconductor package are arranged on both surfaces of the connection parts in which surge current flows. Thus, the semiconductor package can be prevented from breaking and malfunctioning more reliably.

According to the semiconductor package of the present invention, the protection elements are configured by nonlinear resistor bodies formed in a thin-film shape. Thus, the protection elements can easily be provided in the semiconductor package.

If adjacent ones of the protection elements are not separated from each other, current induced by an electromagnetic pulse flows around an adjacent connection part to flow to the IC chip through another connection part. However, this phenomenon can be prevented by the semiconductor package of the present invention according to which adjacent ones of the protection elements are separated from each other. Consequently, the semiconductor package can be prevented from breaking and malfunctioning more reliably.

DESCRIPTION OF EMBODIMENTS

First Embodiment

Figures 1, 2:
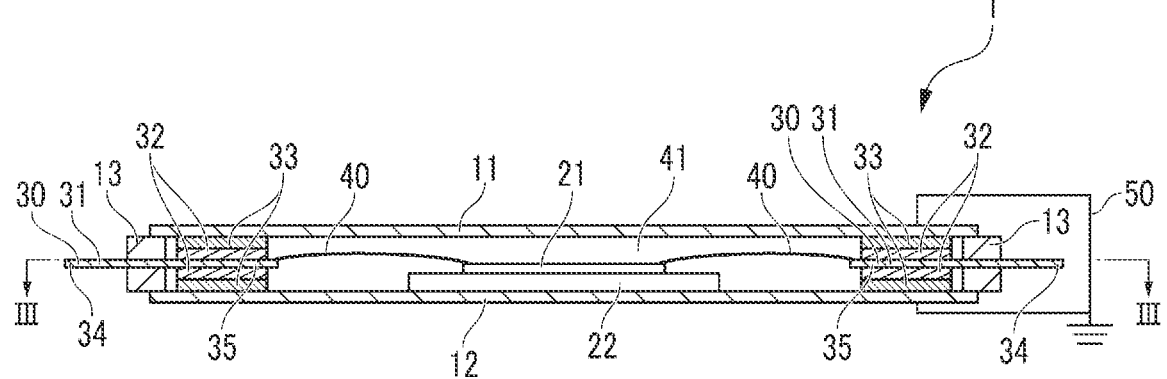
FIG. 1 is a top view of a semiconductor package according to a first embodiment of the present invention.
FIG. 2 is a cross-sectional view showing a II-II cross-section of the semiconductor package in FIG. 1.
Figures 3, 4:
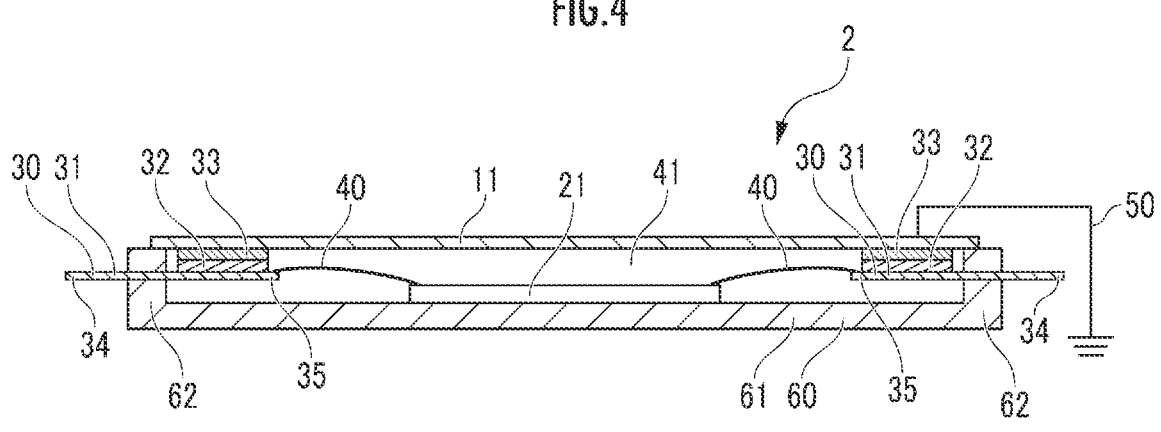
FIG. 3 is a cross-sectional view showing a III-III cross-section of the semiconductor package in FIG. 2.
FIG. 4 is a cross-sectional view equivalent to FIG. 2, showing a cross-section of a semiconductor package according to a second embodiment of the present invention.

Hereinafter, a semiconductor package 1 which is a first embodiment of the present invention will be described with reference to the appended drawings. FIG. 1 is a top view of the semiconductor package 1 according to the first embodiment of the present invention. FIG. 2 is a cross-sectional view showing a II-II cross-section of the semiconductor package 1 in FIG. 1. FIG. 3 is a cross-sectional view showing a III-III cross-section of the semiconductor package 1 in FIG. 2.

As shown in FIG. 1, the semiconductor package 1 is formed in a rectangular shape. The semiconductor package 1 includes a plurality of connection parts 30 formed in a flat-plate shape on the entire circumference of an outer circumferential end of the semiconductor package 1. The plurality of connection parts 30 are respectively connected to corresponding wiring parts provided for an electronic circuit not shown on which the semiconductor package 1 is installed. An insulator 13 is arranged on the entire circumference of the outer circumferential end of the semiconductor package 1. The plurality of connection parts 30 are arranged to extend though the insulator 13, each being oriented from the inside to the outside of the semiconductor package 1 in the longitudinal direction.

The structure of the semiconductor package 1 will be described further with reference to FIG. 2 to FIG. 3. The semiconductor package 1 includes a substrate 12, a seal lid 11, an IC chip 21, an insulation base 22 on which the IC chip 21 is placed, the plurality of connection parts 30 which connect the IC chip 21 and the outside, bonding wires 40, the insulator 13 arranged on an outer circumferential portion of the semiconductor package 1, protection elements 32, and external bypass elements 33. The semiconductor package 1 is configured as an airtight package having an inner space 41 formed by the substrate 12, the seal lid 11, the plurality of connection parts 30, the protection elements 32, and the external bypass elements 33. The inner space 41 is sealed with a sealant such as epoxy resin.

The substrate 12 is a member that configures a bottom plate of the semiconductor package 1 and flows current caused by a high-voltage pulse to the ground. The substrate 12 is a conductive member formed in a rectangular shape in conformance with the shape of the semiconductor package 1. The substrate 12 is formed of a metal plate. As shown in FIG. 2, a ground wire 50 is connected to the substrate 12, and connected to a member not shown having a ground potential.

The seal lid 11 is a member that configures an upper plate of the semiconductor package 1 and flows current caused by a high-voltage pulse to the ground. The seal lid 11 is a conductive member formed in a rectangular shape in conformance with the shape of the semiconductor package 1. The seal lid 11 is formed of a metal plate. As shown in FIG. 2, the ground wire 50 is connected to the seal lid 11, and connected to a member not shown having the ground potential. For reducing manufacturing cost, an identical member can also be used for the substrate 12 and the seal lid 11.

The IC chip 21 is a silicon chip having an electronic circuit formed on a surface as is publicly known. The IC chip 21 is placed on the insulation base 22, and arranged on the substrate 12 together with the insulation base 22.

As is publicly known, the connection parts 30 are members which connect the IC chip 21 to an external apparatus of the semiconductor package 1 via the bonding wires 40 connected to the IC chip 21, and are connection pins 31 in the first embodiment. The connection pins 31 are formed of flat plates made of metal. The plurality of connection pins 31 are arranged such that the longitudinal directions of the connection pins 31 are perpendicular to respective outer circumferential lines of four outer circumferential lines which define the rectangular shape of the outer circumference of the semiconductor package 1, and arranged along the outer circumferential lines of the semiconductor package 1 at predetermined intervals between one another. The plurality of connection pins 31 are each arranged with an inner end 35 which is one end of each of the connection pins 31 exposed to the inner space 41 of the semiconductor package 1 and an outer end 34 which is the other end exposed to the outside of the semiconductor package 1, and arranged to extend through the insulator 13 arranged on the entire circumference of the outer circumferential end of the semiconductor package 1.

The external bypass elements 33 are members arranged respectively between the connection pins 31 and the seal lid 11 and the substrate 12 to keep airtightness of the semiconductor package 1 and flowing current caused by a high-voltage pulse flowing from the protection elements 32 to the seal lid 11 or the substrate 12. As shown in FIG. 3, the external bypass elements 33 are continuously arranged on the entire circumference along the outer circumferential end of the semiconductor package 1 so as to overlap the plurality of connection pins 31 arranged along the outer circumference of the semiconductor package 1. In addition, the external bypass elements 33 are arranged between the seal lid 11 or the substrate 12 and the protection elements 32 arranged in contact with both surfaces of the connection pins 31.

The external bypass elements 33 are hermetic seals formed of a conductive material, for example. Any material that is a conductive hermetic seal can be used, and the semiconductor package 1 can be manufactured economically with a low-melting-point brazing material. For example, thermocompression bonding is performed in a state where the external bypass elements 33 are arranged between the seal lid 11 or the substrate 12 and the protection elements 32 arranged in contact with the respective surfaces of the connection pins 31. The seal lid 11 and the substrate 12 are fixed airtightly, so that the semiconductor package 1 is sealed.

The protection elements 32 are members that when a high-voltage pulse is applied to the semiconductor package 1, flow current not to the bonding wires 40 side but to the external bypass elements 33 side. The protection elements 32 are respectively arranged in contact with both the surfaces of the connection pins 31. The protection elements 32 have properties in which a resistance value is high when a low voltage which is a normal starting voltage of the semiconductor package 1 is applied, and the resistance value decreases when a high voltage current is applied.

The protection elements 32 are nonlinear resistor bodies formed in a thin-film shape, for example. Any process such as a spray method or thin section cutting from a bulk body may be used as a technique for forming the protection elements 32 in a thin-film shape besides a typical thin film forming technique such as sputtering or CVD. Any material having nonlinear resistive properties, such as a composite material obtained by dispersing conductive powder or nonlinear resistive powder in an insulator such as resin, may be used as the nonlinear resistor bodies besides what is called a semiconductor material such as an avalanche diode or a varistor. Whichever material is used, the protection elements 32 are formed thin and arranged such that the protection elements 32 can be arranged in contact with the seal lid 11 or the substrate 12 and the respective surfaces of the connection pins 31. The configuration enables a pulse protection structure to be achieved in a compact size. The protection elements 32 do not include an inductance component such as a lead wire because of having a thin-film shape. This also brings an advantage that a high-voltage pulse can be prevented from increasing in voltage value. It is preferable that the interval between ends of adjacent ones of the protection elements 32 be more than or equal to twice a thickness of the protection elements 32 in the vertical direction.

Consequently, the protection elements 32 function as resistor bodies when a high-voltage pulse is not applied. Thus, current input to the connection pins 31 flows to the IC chip 21 via the bonding wires 40 as usual. On the other hand, when a high-voltage pulse is applied, the resistance value of the protection elements 32 decreases, and thus overcurrent which interrupts the normal operation of the IC chip 21 in the current input to the connection pins 31 passes through the protection elements 32, flows to the seal lid 11 or the substrate 12 via the external bypass elements 33, and thereafter passes through the ground wire 50 connected to the seal lid 11 and the substrate 12 to be grounded. Bypass of this overcurrent causes the voltage applied to the IC chip 21 to be controlled to a level in which the IC chip 21 operates normally.

In other words, when a high-voltage pulse is not applied, current flows to the IC chip 21 so that the IC chip 21 normally performs signal processing, and when a high-voltage pulse is applied, overcurrent associated with the high-voltage pulse can be flown to the ground. Consequently, the bonding wires 40 and the IC chip 21 can be prevented from breaking while maintaining the normal operation of the IC chip 21. In other words, the protection elements 32, the external bypass elements 33, the seal lid 11, and the substrate 12 form a mechanism which bypasses surge current applied to any of the plurality of connection parts 30 from the connection parts 30 to the ground potential via a path different from the plurality of bonding wires 40 without intervention of the plurality of bonding wires 40.

Consequently, the first embodiment of the present invention can provide the semiconductor package 1 capable of achieving protection against an abruptly rising electromagnetic pulse such as an electromagnetic pulse at a device level. Appropriate design of electric specifications (such as V-I characteristics and power rating) of the protection elements in the present invention enables not only an electromagnetic pulse but also a surge and noise to be processed.

Second Embodiment

Hereinafter, a semiconductor package 2 which is a second embodiment of the present invention will be described with reference to FIG. 4. FIG. 4 is a cross-sectional view equivalent to FIG. 2 of the first embodiment, showing a cross-section of the semiconductor package 2 according to the second embodiment of the present invention. In the second embodiment, members identical or corresponding to members of the first embodiment are denoted by identical reference characters, and description will be omitted.

The semiconductor package 2 is formed in a rectangular shape as seen from top similarly to the semiconductor package 1. The semiconductor package 2 which is the second embodiment is different from the semiconductor package 1 of the first embodiment in that the semiconductor package 2 includes a substrate 60 and does not include the insulator 13 and the insulation base 22 while the semiconductor package 1 includes the substrate 12, the insulator 13, and the insulation base 22. The semiconductor package 2 is also different from the semiconductor package 1 in that the protection elements 32 arranged adjacent to the connection parts 30 and the external bypass elements 33 are arranged only on the upper side on one side of the connection parts 30 in the semiconductor package 2 while in the semiconductor package 1, the protection elements 32 arranged adjacent to the connection parts 30 and the external bypass elements 33 are arranged respectively on both sides of the connection parts 30 in the vertical direction.

The semiconductor package 2 includes the substrate 60, the seal lid 11, the IC chip 21, the plurality of connection parts 30 which connect the IC chip 21 and the outside, the bonding wires 40, the protection elements 32, and the external bypass elements 33.

The substrate 60 has a bottom part 61 formed in a plate shape and a rectangular shape, and an outer circumferential part 62 arranged on the entire circumference of an outer circumferential edge part of the bottom part 61. The outer circumferential part 62 is arranged on the outer circumferential edge part of the bottom part 61 in a manner surrounding the bottom part 61 along outer circumferential lines of the bottom part 61 formed in the rectangular shape. The seal lid 11 is arranged on the outer circumferential part 62 in contact with the entire circumference of an upper surface of the outer circumferential part 62. The inner space 41 is formed by the substrate 60 and the seal lid 11. The IC chip 21 is placed on the bottom part 61 and arranged in the inner space 41. The inner space 41 is sealed with epoxy resin or the like. The substrate 60 is formed of an insulator.

The connection parts 30 are members which connect the IC chip 21 to an external apparatus of the semiconductor package 2 via the bonding wires 40 connected to the IC chip 21 as is publicly known, and are the connection pins 31 in the second embodiment. The plurality of connection pins 31 are arranged such that the longitudinal directions of the connection pins 31 are perpendicular to respective outer circumferential lines of four outer circumferential lines which define the rectangular shape of the outer circumference of the semiconductor package 2, and arranged along the outer circumferential lines of the semiconductor package 2 at predetermined intervals between one another. The plurality of connection pins 31 are each arranged with the inner end 35 which is one end of each of the connection pins 31 exposed to the inner space 41 of the semiconductor package 2 and the outer end 34 which is the other end exposed to the outside of the semiconductor package 2, and arranged to extend through the outer circumferential part 62 arranged on the entire circumference of the outer circumferential end of the semiconductor package 2.

Next, a flow of current in the semiconductor package 2 will be described. Since the protection elements 32 function as resistor bodies when a high-voltage pulse is not applied, current input to the connection pins 31 flows to the IC chip 21 via the bonding wires 40 as usual. On the other hand, when a high-voltage pulse is applied, the resistance value of the protection elements 32 decreases, and thus overcurrent which interrupts the normal operation of the IC chip 21 in the current input to the connection pins 31 passes through the protection elements 32, flows to the seal lid 11 via the external bypass elements 33, and thereafter passes through the ground wire 50 connected to the seal lid 11 to be grounded. Bypass of this overcurrent causes the voltage applied to the IC chip 21 to be controlled to the level in which the IC chip 21 operates normally.

In other words, when a high-voltage pulse is not applied, current flows to the IC chip 21 so that the IC chip 21 normally performs signal processing, and when a high-voltage pulse is applied, overcurrent associated with the high-voltage pulse can be flown to the ground. Consequently, the bonding wires 40 and the IC chip 21 can be prevented from breaking while maintaining the normal operation of the IC chip 21. In other words, the protection elements 32, the external bypass elements 33, and the seal lid 11 form a mechanism which bypasses surge current applied to any of the plurality of connection pins 31 from the connection pins 31 to the ground potential without intervention of the plurality of bonding wires 40.

Consequently, the second embodiment of the present invention can provide the semiconductor package 2 capable of achieving protection against an abruptly rising electromagnetic pulse such as an electromagnetic pulse at the device level. Appropriate design of electric specifications (such as V-I characteristics and power rating) of the protection elements in the present invention enables not only an electromagnetic pulse but also a surge and noise to be processed.

Third Embodiment

Figure 5:
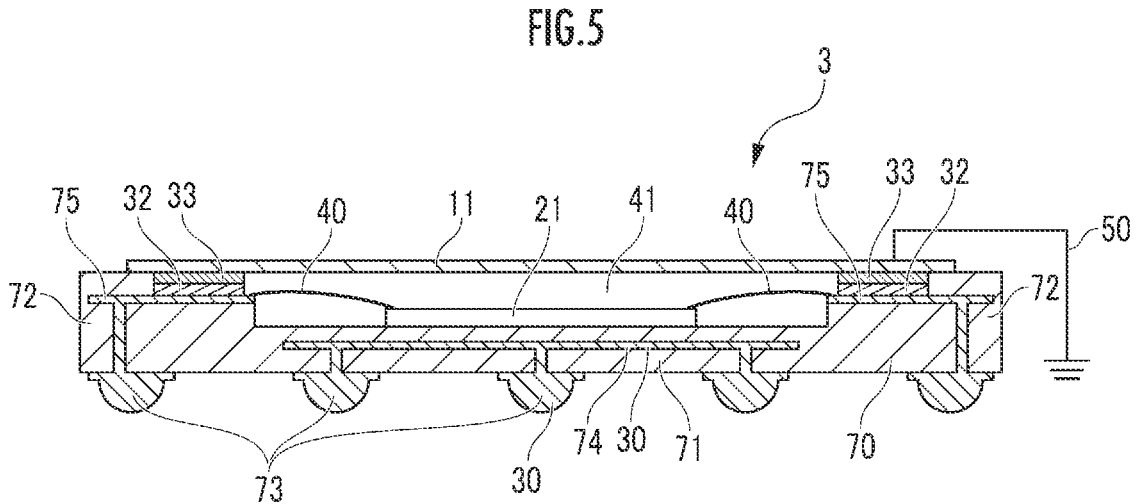
FIG. 5 is a cross-sectional view equivalent to FIG. 2, showing a cross-section of a semiconductor package according to a third embodiment of the present invention.

Hereinafter, a semiconductor package 3 which is a third embodiment of the present invention will be described with reference to FIG. 5. FIG. 5 is a cross-sectional view equivalent to FIG. 2 of the first embodiment, showing a cross-section of the semiconductor package 3 according to the third embodiment of the present invention. In the third embodiment, members identical or corresponding to members of the first embodiment are denoted by identical reference characters, and description will be omitted.

The semiconductor package 3 is formed in a rectangular shape as seen from top similarly to the semiconductor package 1. The semiconductor package 3 which is the third embodiment is different from the semiconductor package 1 of the first embodiment in that the semiconductor package 3 includes a substrate 70 and does not include the insulator 13 and the insulation base 22 while the semiconductor package 1 includes the substrate 12, the insulator 13, and the insulation base 22. The semiconductor package 3 is also different from the semiconductor package 1 in that the protection elements 32 arranged adjacent to the connection parts 30 and the external bypass elements 33 are arranged only on the upper side on one side of the connection parts 30 in the semiconductor package 3 while in the semiconductor package 1, the protection elements 32 arranged adjacent to the connection parts 30 and the external bypass elements 33 are arranged respectively on both sides of the connection parts 30 in the vertical direction. Moreover, the connection parts 30 have shapes different from each other.

The semiconductor package 3 includes the substrate 70, the seal lid 11, the IC chip 21, the plurality of connection parts 30 which connect the IC chip 21 and the outside, the bonding wires 40, the protection elements 32, and the external bypass elements 33.

The substrate 70 has a bottom part 71 formed in a plate shape and a rectangular shape, and an outer circumferential part 72 arranged on the entire circumference of an outer circumferential edge part of the bottom part 71. The outer circumferential part 72 is arranged on the outer circumferential edge part of the bottom part 71 in a manner surrounding the bottom part 71 along outer circumferential lines of the bottom part 71 formed in the rectangular shape. The seal lid 11 is arranged on the outer circumferential part 72 in contact with the entire circumference of an upper surface of the outer circumferential part 72. The inner space 41 is formed by the substrate 70 and the seal lid 11. The IC chip 21 is placed on the bottom part 71 and arranged in the inner space 41. The inner space 41 is sealed with epoxy resin or the like. The substrate 70 is formed of an insulator. The substrate 70 is a ball grid array type package substrate.

The connection parts 30 are members which connect the IC chip 21 to an external apparatus of the semiconductor package 3 via the bonding wires 40 connected to the IC chip 21 as is publicly known, and are solder bumps 73 and wiring circuits 74 in the third embodiment.

The solder bumps 73 are external electrode terminals fixed by welding to an electronic circuit not shown in which the semiconductor package 2 is incorporated so that the semiconductor package 3 and the above-described electronic circuit are electrically connected. A plurality of the solder bumps 73 are provided as a grid on a lower surface of the substrate 70, and are heated and melted to be fixed by welding to corresponding circuit regions of a partner member in which the semiconductor package 3 is incorporated.

The substrate 70 is formed with the plurality of wiring circuits 74 provided inside the substrate 70. The plurality of wiring circuits 74 are arranged to serve as a predetermined path on the bottom part 71 of the substrate 70 in parallel to the lower surface of the bottom part 71. Inside the outer circumferential part 72 of the substrate 70, the wiring circuits 74 have a plurality of outer circumferential part wires 75 formed in parallel to the lower surface of the bottom part 71 and in a predetermined path. The plurality of outer circumferential part wires 75 are arranged such that the longitudinal directions of the outer circumferential part wires 75 are perpendicular to respective outer circumferential lines of four outer circumferential lines which define the rectangular shape of the outer circumference of the semiconductor package 3, and arranged along the outer circumferential lines of the semiconductor package 3 at predetermined intervals between one another. Each of the solder bumps 73 is connected to a corresponding one of the wiring circuits 74. The IC chip 21 is connected to the corresponding plurality of outer circumferential part wires 75 provided on the outer circumferential part 72. In other words, the IC chip 21 is connected to the plurality of corresponding respective solder bumps 73.

On respective upper surfaces of the plurality of outer circumferential part wires 75 provided on the outer circumferential part 72, the respective protection elements 32 are arranged in contact with the upper surfaces of the outer circumferential part wires 75. On respective upper surfaces of the plurality of protection elements 32, the respective external bypass elements 33 are arranged in contact with the upper surfaces of the protection elements 32. The lower surface of the seal lid 11 is arranged in contact with both the upper surface of the outer circumferential part 72 and the upper surfaces of the external bypass elements 33.

Next, a flow of current in the semiconductor package 3 will be described. Since the protection elements 32 function as resistor bodies when a high-voltage pulse is not applied, current input to the solder bumps 73 which are the connection parts 30 flows to the IC chip 21 via the wiring circuits 74 and the bonding wires 40 as usual. On the other hand, when a high-voltage pulse is applied, the resistance value of the protection elements 32 decreases, and thus overcurrent which interrupts the normal operation of the IC chip 21 in the current input to the solder bumps 73 passes through the protection elements 32, flows to the seal lid 11 via the external bypass elements 33, and thereafter passes through the ground wire 50 connected to the seal lid 11 to be grounded to a member having the ground potential. Bypass of this overcurrent causes the voltage applied to the IC chip 21 to be controlled to the level in which the IC chip 21 operates normally.

In other words, when a high-voltage pulse is not applied, current flows to the IC chip 21 so that the IC chip 21 normally performs signal processing, and when a high-voltage pulse is applied, overcurrent associated with the high-voltage pulse can be grounded. Consequently, the bonding wires 40 and the IC chip 21 can be prevented from breaking while maintaining the normal operation of the IC chip 21. In other words, the protection elements 32, the external bypass elements 33, and the seal lid 11 form a mechanism which bypasses surge current applied to any of the plurality of solder bumps 73 from the solder bumps 73 to the member having the ground potential without intervention of the plurality of bonding wires 40.

Consequently, the third embodiment of the present invention can provide the semiconductor package 3 capable of achieving protection against an abruptly rising electromagnetic pulse such as an electromagnetic pulse at the device level. Appropriate design of electric specifications (such as V-I characteristics and power rating) of the protection elements in the present invention enables not only an electromagnetic pulse but also a surge and noise to be processed.

REFERENCE SIGNS LIST

1, 2, 3 semiconductor package
11 seal lid
12, 60, 70 substrate
21 IC chip
30 connection part
32 protection element
33 external bypass element
40 bonding wire

The invention claimed is:

1. A semiconductor package comprising:
a substrate;
an IC chip arranged on the substrate;
a plurality of connection parts configured to connect the IC chip to an outside;
a plurality of bonding wires configured to connect the IC chip and corresponding ones of the plurality of connection parts;
a mechanism configured to bypass surge current applied to any of the plurality of connection parts from the connection parts to a ground potential via a path different from the plurality of bonding wires;
a seal lid arranged to be faced to the substrate;
protection elements arranged in contact with surfaces of the plurality of respective connection parts on at least one side in a vertical direction and having a resistance value which decreases when a voltage of more than or equal to a predetermined value is applied; and
conductive external bypass elements arranged in contact with surfaces of the protection elements on a side opposite to the plurality of respective connection parts, wherein
the external bypass elements include at least one of the external bypass elements arranged in contact with the substrate and at least one other of the external bypass elements arranged in contact with the seal lid,
the protection elements are arranged in contact with respective surfaces of the plurality of connection parts on both surface sides.

2. The semiconductor package according to claim 1, wherein the protection elements are nonlinear resistor bodies formed in a thin-film shape.

3. The semiconductor package according to claim 1, wherein adjacent ones of the protection elements are arranged separately from each other.

\* \* \* \* \*